US006236080B1

(12) United States Patent
Lou

(10) Patent No.: US 6,236,080 B1
(45) Date of Patent: May 22, 2001

(54) METHOD OF MANUFACTURING A CAPACITOR FOR HIGH DENSITY DRAMS

(75) Inventor: Chine-Gie Lou, Hsinchu Hsien (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/358,761

(22) Filed: Jul. 22, 1999

(51) Int. Cl.⁷ .............................................. H01L 21/8242
(52) U.S. Cl. ......................... 257/306; 438/253; 438/255; 438/398
(58) Field of Search ................... 438/250–256, 438/393–398

(56) References Cited

U.S. PATENT DOCUMENTS

| | | | |
|---|---|---|---|
| 5,670,405 | * 9/1997 | Tseng | 438/253 |
| 5,723,373 | * 3/1998 | Chang et al. | 438/253 |
| 5,726,085 | * 3/1998 | Crenshaw et al. | 438/255 |
| 5,756,388 | * 5/1998 | Wu | 438/397 |
| 5,817,554 | * 10/1998 | Tseng | 438/253 |
| 5,827,766 | * 10/1998 | Lou | 438/253 |
| 5,877,052 | * 3/1999 | Lin et al. | 438/238 |
| 5,963,804 | * 10/1999 | Figura et al. | 438/255 |
| 6,037,219 | * 3/2000 | Lin et al. | 438/255 |
| 6,046,083 | * 4/2000 | Lin et al. | 438/255 |
| 6,074,913 | * 6/2000 | Lou et al. | 438/255 |
| 6,090,664 | * 7/2000 | Lou | 438/255 |
| 6,090,679 | * 7/2000 | Lou | 438/396 |
| 6,143,605 | * 11/2000 | Lou | 438/255 |
| 6,146,968 | * 11/2000 | Lu et al. | 438/398 |
| 6,159,793 | * 12/2000 | Lou | 438/255 |

FOREIGN PATENT DOCUMENTS

| | | |
|---|---|---|
| 0902462 A1 | * 3/1999 | (EP) . |
| 6-204402 | * 7/1994 | (JP) . |
| 7-263630 | * 10/1995 | (JP) . |

* cited by examiner

*Primary Examiner*—Eddie C. Lee
*Assistant Examiner*—José R Diaz

(57) ABSTRACT

A method for manufacturing an integrated circuit capacitor is provided in the present invention. First, a semiconductor substrate is etched to form a contact hole. A conducting plug is then formed into the contact hole. Next, a dielectric layer is formed on the semiconductor substrate and the conducting plug. The dielectric layer is etched by photolithography to form an opening for exposing the top surfaces of the conducting plug and a portion of the semiconductor substrate. A plurality of discrete rugged polysilicon grains are formed on the surfaces of the dielectric layer, the conducting plug and the semiconductor substrate. The dielectric layer is next etched to form a plurality of cavities on a top surface of the dielectric layer by using the plurality of discrete rugged polysilicon grains as an etching mask. A first conducting layer is formed on the surfaces of the plurality of discrete rugged polysilicon grains, the dielectric layer, the semiconductor substrate and the conducting plug, and filling into the plurality of cavities to form a plurality of vertical fins. Then, the plurality of discrete rugged polysilicon grains and the first conducting layer are etched to define a bottom electrode. The dielectric layer is removed. A capacitor dielectric film is formed on the outer surfaces of the first conducting layer, the plurality of discrete rugged polysilicon grains and the semiconductor substrate. A second conducting layer is deposited on the outer surface of the capacitor dielectric film to serve as a top electrode.

20 Claims, 4 Drawing Sheets

US 6,236,080 B1

METHOD OF MANUFACTURING A CAPACITOR FOR HIGH DENSITY DRAMS

FIELD OF THE INVENTION

The present invention relates to a process for manufacturing semiconductor DRAM cells, and more specifically, to a method for forming a capacitor with a crown shaped structure and a plurality of vertical fins.

BACKGROUND OF THE INVENTION

Semiconductor Dynamic Random Access Memory (DRAM) devices have been applied widely in the integrated circuits with the advance of semiconductor manufacture. Typically, a memory cell consists of a storage capacitor and an access transistor for each bit to be stored by the semiconductor DRAM. Either the source or drain of the transistor is connected to one terminal of the capacitor. The other side of the transistor and the transistor gate electrode are connected to external connection lines called the bit line and the word line, respectively. The other terminal of the capacitor is connected to a reference voltage. Thus, the formation of a DRAM memory cell comprises the formation of a transistor, a capacitor and contacts to external circuits.

However, with the coming of Ultra Large Scale Integrated (ULSI) DRAM devices, the sizes of memory cells have gotten smaller and smaller such that the area available for a single memory cell has become very small. This has caused a reduction in capacitor area, which in turn results in a reduction in cell capacitance. Namely, the amount of the charge capable of being stored by the capacitor decreases. Besides, for very small memory cells, planar capacitors produced have lower reliability in operation. Accordingly, the important issue currently is how to promote the capacitance and reliability of capacitors with the decreasing scale of the devices and the increasing integration of the integrated circuits.

For resolving the above problems, the manufacture of capacitors tends to increase the surface area of the storage electrode, and results in the development of the various types of capacitors such as the trench capacitor and the stacked capacitor. Except the high dielectric films are used for the capacitor, the bottom electrodes such as the crown shaped structure, the fin shaped structure, the spread shaped structure and cylinder shaped structure are also used to increase the storage efficiency for the capacitors manufactured in the limited areas. However, the capacitances of those stack structures can still hardly to provide enough storage spaces for satisfying the capacitance required for 256M or 1 G DRAM within the limited design rule. Especially, as described above, with the integration of the semiconductor devices increasing, the areas which the various devices occupied become smaller and smaller, and the scales of the devices are sustained shrinking. Thus, the required fin shaped structures and the spread shaped structures can not be defined effectively and successfully in the limited areas by using the conventional technique due to the restriction of the microlithography. Therefore, the yield and storage capacitance of the capacitors manufactured by the prior technique and process can not promoted effectively when the areas that the devices occupied still shrunk.

SUMMARY OF THE INVENTION

The prime objective of the present invention is to provide a method for manufacturing the integrated circuit capacitor with an increasing bottom electrode surface area.

The second objective of the present invention is to provide a method for manufacturing the DRAM cell with the crown shaped electrode which comprises of a plurality of arch structures for increasing the surface areas.

The another objective of the present invention is to form the capacitor with a plurality of fin shaped structures defined by using the plurality of discrete rugged polysilicon grains.

A method for manufacturing an integrated circuit capacitor is provided in the present invention. First, an oxide layer and a nitride layer are formed on a semiconductor substrate in sequence. An etching step is performed to etch the nitride layer and the oxide layer for defining a contact hole on the semiconductor substrate. A conducting plug is then formed into the contact hole. Next, a dielectric layer is formed on the nitride layer and the conducting plug. The dielectric layer is etched to form an opening for exposing the top surfaces of the conducting plug and a portion of the nitride layer. A plurality of discrete rugged polysilicon grains are formed on the exposed surfaces of the dielectric layer, the conducting plug and the nitride layer. The dielectric layer is next etched to form a plurality of cavities on the top surface of the dielectric layer by using the plurality of discrete rugged polysilicon grains as an etching mask. A first conducting layer is formed on the surfaces of the plurality of discrete rugged polysilicon grains, the dielectric layer, the nitride layer and the conducting plug, and filling into the plurality of cavities to form a plurality of vertical fins. Then, the plurality of discrete rugged polysilicon grains and the first conducting layer are etched to define a bottom electrode. After removing the dielectric layer, a capacitor dielectric film is formed on the outer surfaces of the first conducting layer, the plurality of discrete rugged polysilicon grains and the nitride layer. A second conducting layer is deposited on the outer surface of the capacitor dielectric film to serve as a top electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of forming the capacitor with crown shaped structure and vertical fins. The capacitance of the capacitor manufactured by the method proposed hereinafter is promoted due to the surface areas of the bottom electrode are increased by using the discrete rugged polysilicon grains to define the vertical fins. Besides, the arch structures formed of the discrete rugged polysilicon grains and the conducting layer which is used to cover the discrete rugged polysilicon grains can increase the surface areas of the bottom electrode. The scales of the vertical fins defined by the discrete rugged polysilicon grains are smaller than that defined by using the conventional photolithography technique. Thus, the surface areas of the bottom electrodes can be effectively increased and the storage abilities of the capacitors can be mainly promoted when the areas that the capacitors occupied are sustained reducing. The detailed processes will be described as follows.

Figure 1:
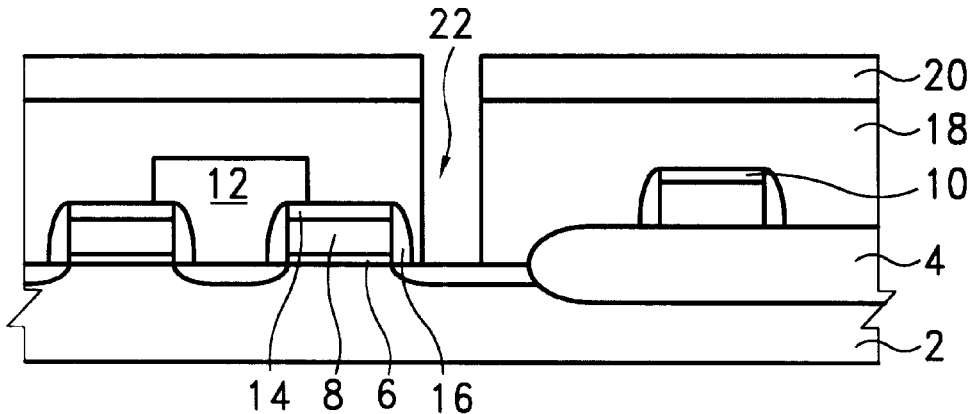
FIG. 1 is a cross sectional view of a semiconductor wafer illustrating the step of forming the various devices on the semiconductor substrate in accordance with the present invention.

Referring to FIG. 1, a single crystal substrate 2 with a <100> crystallographic orientation is used for the preferred embodiment. A thick field oxide 4 (FOX) region is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in an oxygen-steam ambient is used to form the FOX 4 region, to a thickness of about 3000–8000 angstroms. Then, a silicon dioxide layer 6 is created atop the substrate 2 to use as a gate oxide. In the preferred embodiment, the silicon dioxide layer 6 is formed by using an oxygen-steam ambient, at a temperature between about 750 to 900° C. In the preferred embodiment, the thickness of the silicon dioxide layer 6 is approximately 20–100 angstroms. Still referring to FIG. 1, after the silicon dioxide layer 6 is formed, a first polysilicon layer 8 is formed over the silicon dioxide layer 6 and the FOX region 4. In the preferred embodiment, the first polysilicon layer 8 is formed by using conventional chemical vapor deposition (CVD) to have a thickness about 1000–5000 angstroms. Then, a word line 10, a bit line 12, gate structures with cap layer 14, and side wall spacers 16, are formed by well known technology and is not particularly germane to the present invention. Thus, only a cursory description of the formation of gate structure is given here.

Refer to FIG. 1, a dielectric layer 18 for isolation is formed on the gate structures, FOX 4 and substrate 2 to a thickness about 3000–8000 angstroms. The dielectric layer 18 is preferably formed of silicon oxide. A nitride layer 20 is subsequently formed on the dielectric layer 18. The nitride layer 20 is used as a stopping layer in latter removing steps. The nitride layer 20 has a thickness at a range about 500–1500 angstroms. Then, a contact hole 22 is formed on the substrate 2. In a preferred embodiment, a photoresist is pattern firstly on the nitride layer 20 to define a region where will be generated a contact hole. An etching is used to etch the dielectric layer 18 and the nitride layer 20 to form the contact hole 22. In one embodiment, a plasma anisotropic etching is performed to create the contact hole 22 for storage node contact. The etchant to remove oxide is selected from the group of $CCl_2F_2$, $CHF_3/CF_4$, $CHF_3/O_2$, $CH_3CHF_2$, $CF_4/O_2$, while the nitride layer is removed by using $CF_4/H_2$, $CHF_3$ or $CH_3CHF_2$.

Figure 2:
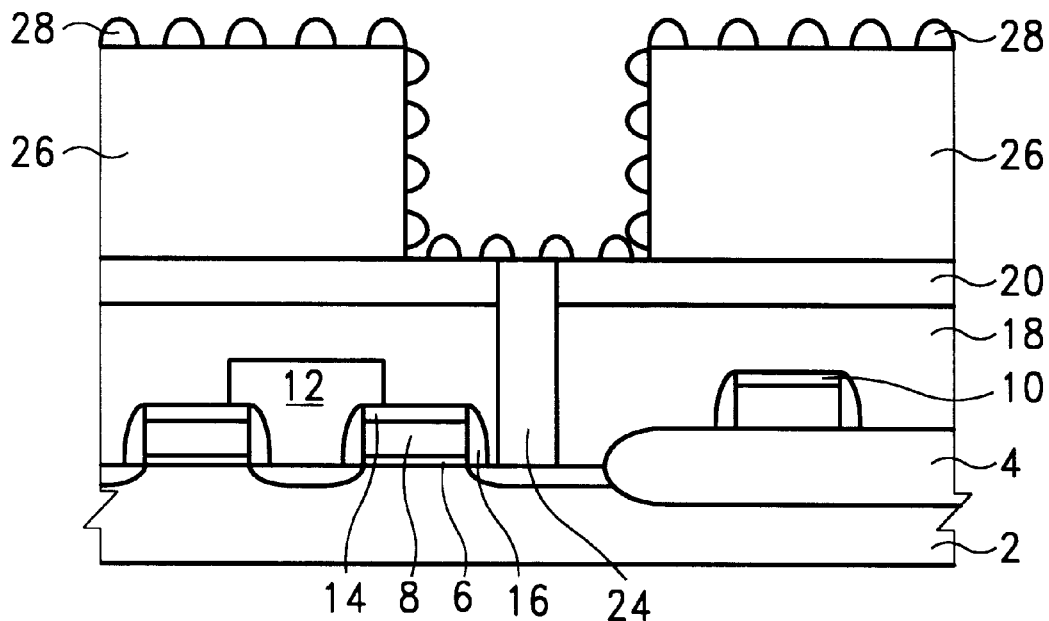
FIG. 2 is a cross sectional view of a semiconductor wafer illustrating the step of forming the dielectric layer and the discrete rugged polysilicon grains on the substrate in accordance with the present invention.

Referring to FIG. 2, after the contact hole 22 is formed on the substrate 2, a conducting plug 24 is formed into the contact hole 22. In general, the conducting plug 24 can be formed of doped polysilicon, in-situ doped polysilicon, aluminum, copper, tungsten, platinum, titanium, or any combinations thereon. In a preferred embodiment, a polysilicon layer is formed on the substrate 2 and filled into the contact hole 22 firstly. Then, an reactive ion etching (RIE) is performed to etch back the polysilicon layer till the nitride layer 20 is reached. Thus, the conducting plug 24 is formed in the contact hole 22. The etchant to etch the polysilicon layer is $SiCl_4/Cl_2$, $BCl_3/Cl_2$, $HBr/Cl_2/O_2$, $HBr/O_2$, $Br_2/SF_6$ or $SF_6$.

After forming the conducting plug 24, a dielectric layer 26 is then formed on the silicon nitride layer 20 and the conducting plug 24. Generally, a silicon oxide layer with a thickness about 5000 to 10000 angstrom is used to be the dielectric layer 26 and is formed by using chemical vapor deposition (CVD) process, using TEOS as a source at a temperature between about 600 to 800° C. at a pressure 0.1 to 1 torrs. Then, the dielectric layer 26 is etched to form an opening on the dielectric layer 26 for defining a crown pattern and exposing top surface of the conducting plug 24 and a portion of the silicon nitride layer 20. In a preferred embodiment, a photoresist layer is formed on the dielectric layer 26 firstly. The photolithography technique is next used to define the pattern on the photoresist layer. Then, the dielectric layer 26 is etched by using the photoresist for serving the etching mask to define the crown pattern on the dielectric layer 26. The etchant used to etch the silicon oxide can chosen from the group of $CCl_2F_2$, $CHF_3/CF_4$, $CHF_3/O_2$, $CH_3CHF_2$ and $CF_4/O_2$.

Next, a plurality of discrete rugged polysilicon grains 28 are formed on the surfaces of the dielectric layer 26, the conducting plug 24 and the silicon nitride layer 20. In an embodiment, the procedures for forming the discrete rugged polysilicon grains 28 are as follows. First, an amorphous silicon (a-silicon) film is formed above the substrate 2. The silicon nuclei are the n seeded on the a-silicon film by using the silicon containing gases such as the $SiH_4$ or $Si_2H_6$ at a temperature about 530 to 560° C. and at a pressure about $10^{-3}$ to $10^{-4}$ torrs. Next, an annealing step is performed to the substrate 2 in a highly vacuumed environment at a temperature about 530 to 560° C. and a pressure about $10^{-8}$ to $10^{-9}$ torrs for forming the plurality of discrete rugged polysilicon grains 28 as illustrated in FIG. 2. In preferred embodiment, each of the plurality of discrete rugged polysilicon grains 28 has the size about 500 to 2000 angstroms, and the distance between any two adjacent rugged polysilicon grains 28 is about 500 to 1500 angstroms.

Figure 3:
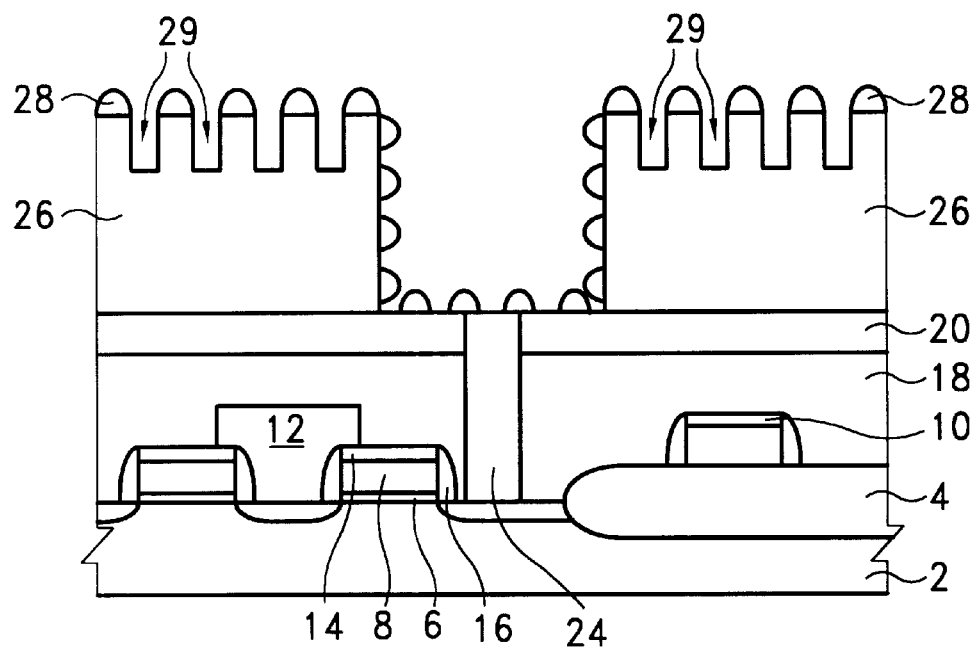
FIG. 3 is a cross sectional view of a semiconductor wafer illustrating the step of etching the dielectric layer by using the rugged polysilicon grains to serve as the etching mask in accordance with the present invention.

Then, as shown in FIG. 3, the dielectric layer 26 is etched to form a plurality of cavities 29 on the top surface of the dielectric layer 26 by using the discrete rugged polysilicon grains 28 to serve as an etching mask. A reactive ion etching (RIE) step is preferred used to etch the dielectric layer 26 and the etchant for etching the dielectric layer 26 can be selected from the group of $CCl_2F_2$, $CHF_3/CF_4$, $CHF_3/O_2$, $CH_3CHF_2$ and $CF_4/O_2$.

Figure 4:
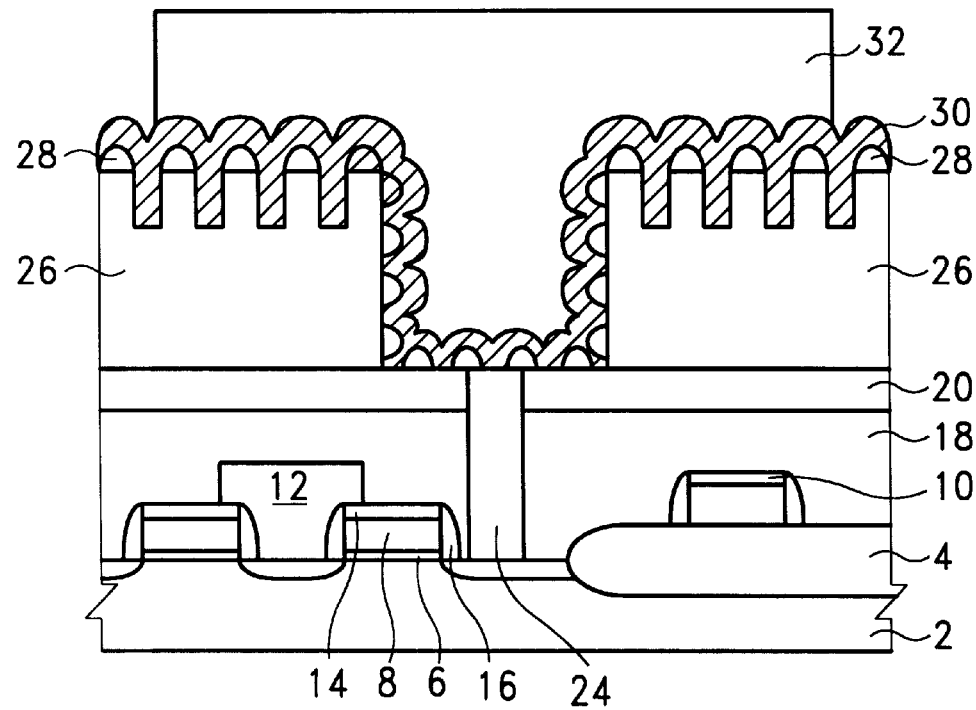
FIG. 4 is a cross sectional view of a semiconductor wafer illustrating the step of forming the first conducting layer on the discrete rugged polysilicon grains and filling into the cavities in accordance with the present invention.

Refer to FIG. 4, a first conducting layer 30 is formed above the substrate 2 to cover the plurality of discrete rugged polysilicon grains 28, the dielectric layer 26, the silicon nitride layer 20 and the conducting plug 24, and to fill into the plurality of cavities 29 for forming a plurality of vertical fins 30, wherein each of the vertical fins 30 has a width about 500 to 1500 angstroms and the distance between each two adjacent vertical fins 30 is about 500 to 2000 angstroms. In a preferred embodiment, an in-situ doped polysilicon layer is formed at a temperature about 540 to 580° C. for serving as the first conducting layer 30. Besides, other conducting materials such as aluminum, copper, tungsten, platinum, titanium and combinations thereon can also be chosen to form the first conducting layer 30. Next, a photoresist layer 32 is formed on the first conducting layer 30 to define the bottom electrode of the capacitor that will be manufactured in latter steps.

Figure 5:
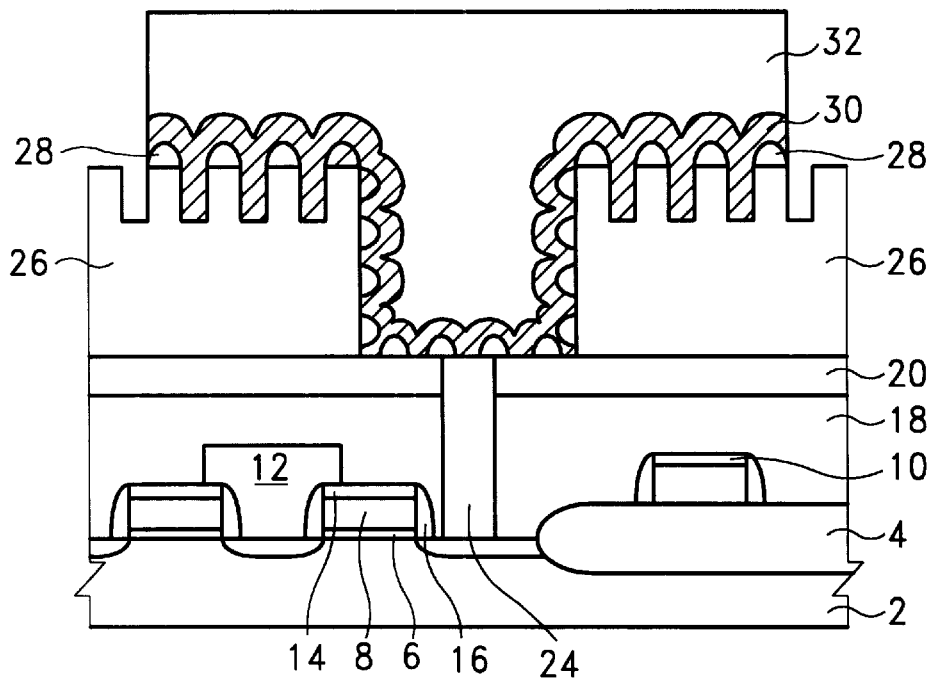
FIG. 5 is a cross sectional view of a semiconductor wafer illustrating the step of etching a portion of the discrete rugged polysilicon grains and a portion of the first conducting layer to define the bottom electrode in accordance with the present invention.

Refer to FIG. 5, by using the photoresist layer 32 as an etching mask, a portion of the first conducting layer 30 and a portion of the discrete rugged polysilicon grains 28 are removed to define the bottom electrode. In an embodiment, the reactive ion etching procedure is performed to etch and remove the first conducting layer 30 and the discrete rugged polysilicon grains 28 exposed by the photoresist layer 32, and the dielectric layer 26 is used to serve as a stopping layer in the etching step. Thus, the bottom electrode of the capacitor is defined.

Figure 6:
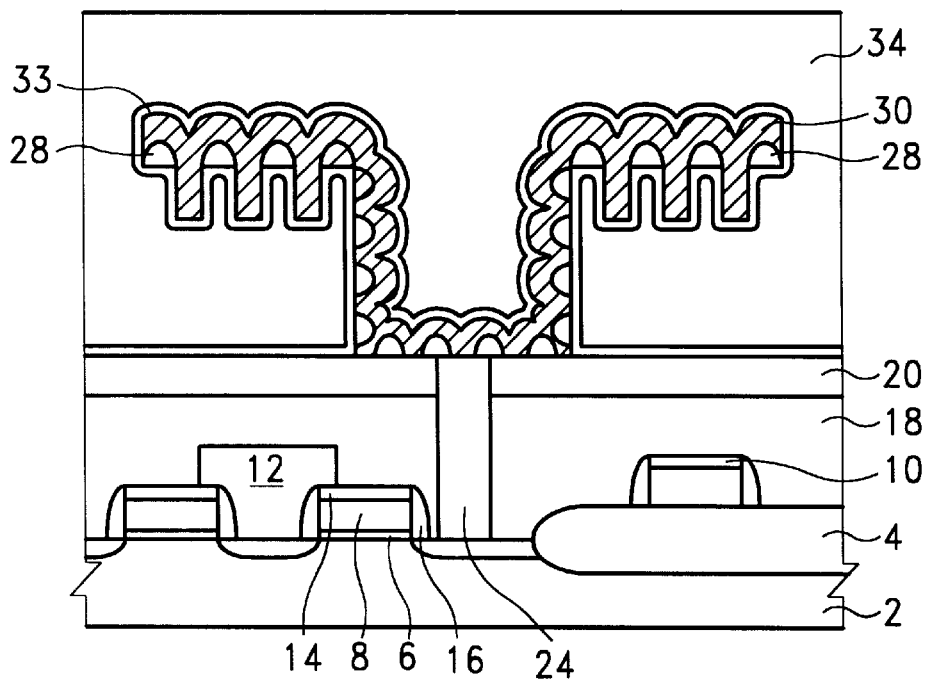
FIG. 6 is a cross sectional view of a semiconductor wafer illustrating the step of forming the capacitor dielectric film and the top electrode in accordance with the present invention.

Refer to FIG. 6, after removing the photoresist layer 32, the dielectric layer 26 are also removed. In general, the diluted HF solution, BOE (buffer oxide etching) solution or other likes can be used to remove the dielectric layer 26. Thus, the bottom electrode formed of the residual rugged polysilicon grains 28 and the residual first conducting layer 30 is as shown in FIG. 6.

Then, along the exposed surfaces of the bottom electrode, a capacitor dielectric film 33 is formed. Namely, the capacitor dielectric film 33 is deposited on the outer surfaces of the first conducting layer 30, the discrete rugged polysilicon grains 28 and the silicon nitride layer 20. In general, the capacitor dielectric film 33 can be chosen from a group of high dielectric ($\geq 20$) materials such as $Ta_2O_5$, BST, PZT and PLZT. Subsequently, a second conducting layer 34 is deposited along the surface of the dielectric film 33 to serve as the top electrode of the capacitor. The second conducting layer 34 can be chosen from the group of doped polysilicon, in-situ doped polysilicon, aluminum, copper, tungsten, platinum, titanium and combinations thereon.

Figure 7:
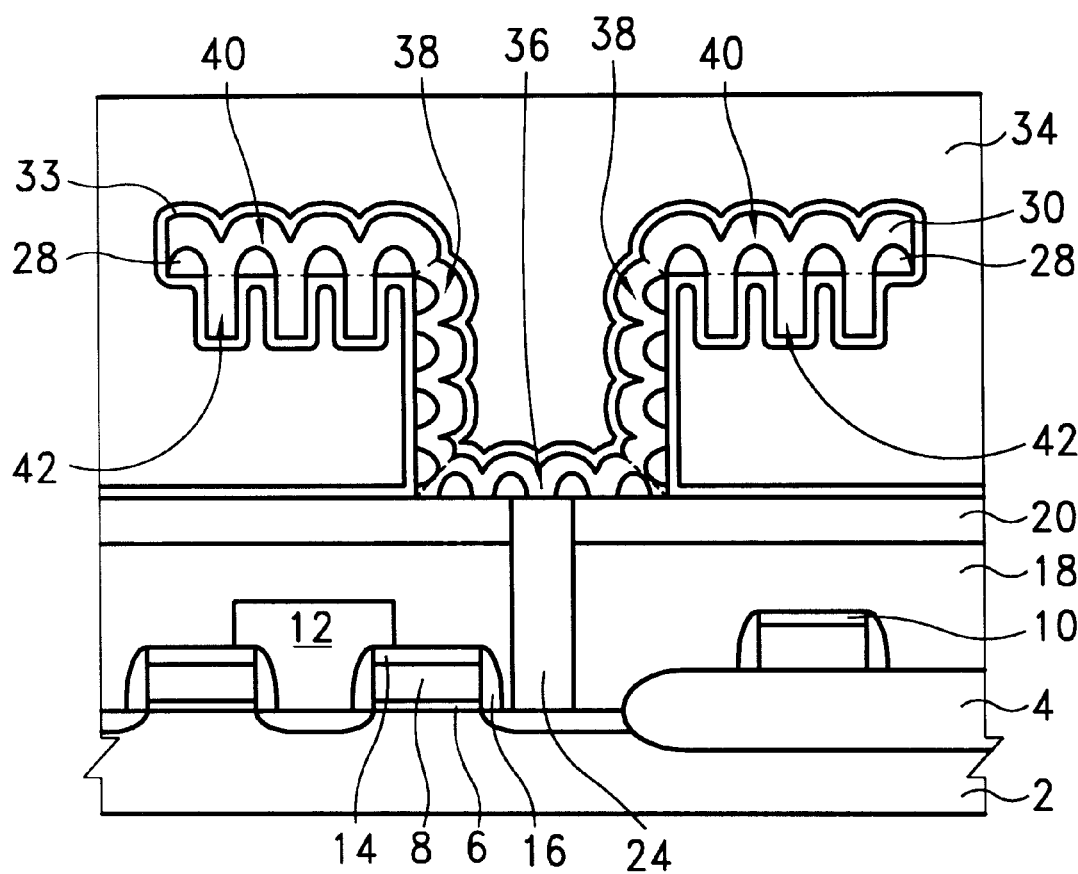
FIG. 7 is a cross sectional view of a semiconductor wafer illustrating the structure of the capacitor manufactured by using the method proposed in the present invention.

Refer to FIG. 7, the structure of the capacitor manufactured by using the process proposed in the present invention is shown. The structure of the capacitor comprises a bottom electrode formed on the substrate 2, a capacitor dielectric film 33 formed on the outer surface of the bottom electrode and a top electrode 34 formed on the outer surface of the capacitor dielectric film 33.

It is noted that the bottom electrode comprises a first horizontal pillar 36 that is electrically connected to the substrate 2 via a conducting plug 24. Two vertical pillars 38 are connected respectively to the two ends of the first horizontal pillar 36 and extend upwards from the two ends of the first horizontal pillar 36. Besides, two second horizontal pillars 40 are connected respectively to two top ends of the two vertical pillars 38 and extend outward from the two top ends of the two vertical pillars 38. A plurality of vertical fins 42 are connected respectively to the lower surfaces of the two second horizontal pillars 40 and extend downwards from the lower surfaces of the two second horizontal pillars 40.

Besides, the first horizontal pillar 36, the vertical pillars 38 and the second horizontal pillars 40 are all formed of a plurality of arch structures, wherein each arch structure comprises a rugged polysilicon grain 28 and a doped polysilicon layer 34 that is used to cover the rugged polysilicon grain 28. Further, the vertical fin 42 as described above is connected to the lower surface of the junction of each two adjacent arch structures. In a preferred embodiment, the distance between two adjacent the vertical fins 42 has a size about 500 to 2000 angstroms, and each vertical fin 42 has a width about 500 to 1500 angstroms.

The first horizontal pillar 36 and the second horizontal pillars 40 all have the uneven top surfaces formed by the plurality of arch structures. The two vertical pillars 38 have the uneven surfaces that face each other formed by the arch structures too. The two vertical pillars 38 extending from the two ends of the first horizontal pillar 36 construct a crown shaped structure. In addition, a capacitor dielectric layer 33 is formed on the surface of the bottom electrode, and a top electrode 34 is formed on the outer surface of the capacitor dielectric layer 33.

The present invention can provide various benefits over the prior art. First, the capacitance of the capacitor manufactured by the method proposed hereinafter is promoted due to the surface areas of the bottom electrode are increased by using the discrete rugged polysilicon grains to define the cavities and forming the conducting layer to fill into the cavities for forming the vertical fins. Especially, the scales of the vertical fins defined by using the discrete rugged polysilicon grains are smaller and finer than the limited scales defined by using the conventional photolithography techniques. Accordingly, for the capacitors which the areas the devices occupied still decreasing, the bottom electrode pattern can be defined effectively by using the method proposed in the present invention.

Besides, the arch structures formed of the discrete rugged polysilicon grains and the conducting layer which is used to cover the discrete rugged polysilicon grains can increase the surface areas of the bottom electrode effectively. The undesired structure stress caused by the various devices formed above the capacitor in latter steps can not affect and damage directly to the fine fin shaped structures due to the vertical fins are formed beneath the second horizontal pillars. Thus, the surface areas of the bottom electrodes can be effectively increased and the storage abilities of the capacitors can be mainly promoted when the areas that the capacitors occupied are sustained reducing. The yields and efficiency of the capacitor are further promoted too.

As is understood by a person skilled in the art, the foregoing preferred embodiment of the present inventions are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a semiconductor capacitor, which method comprises the steps of:
   etching a semiconductor substrate to form a contact hole;
   forming a conducting plug in said contact hole;
   forming a dielectric layer on said semiconductor substrate and said conducting plug;
   etching said dielectric layer to form an opening on said dielectric layer for exposing top surfaces of said conducting plug and a portion of said semiconductor substrate;
   forming a plurality of discrete rugged polysilicon grains on surfaces of said dielectric layer, said conducting plug and said semiconductor substrate;

etching said dielectric layer to form a plurality of cavities on a top surface of said dielectric layer by using said discrete rugged polysilicon grains to serve as an etching mask;

forming a first conducting layer on the surfaces of said discrete rugged polysilicon grains, said dielectric layer, said semiconductor substrate and said conducting plug, and filling into said cavities to form a plurality of vertical fins;

removing a portion of said discrete rugged polysilicon grains and a portion of said first conducting layer to define a bottom electrode;

removing said dielectric layer;

forming a capacitor dielectric film on outer surfaces of said first conducting layer, said discrete rugged polysilicon grains and said semiconductor substrate; and forming a second conducting layer on an outer surface of said capacitor dielectric film to serve as a top electrode.

2. The method of claim 1, which further comprises the following steps before etching said semiconductor substrate to form said contact hole:

forming a silicon oxide layer on said semiconductor substrate; and forming a silicon nitride layer on said silicon oxide layer.

3. The method of claim 1, wherein said dielectric layer is formed of a silicon oxide layer with a thickness about 5000 to 10000 angstroms.

4. The method of claim 3, wherein said dielectric layer is removed by an etchant comprised of a material selected from the group consisting of a BOE (buffer oxide etching) solution and a HF solution.

5. The method of claim 1, wherein said step of forming said discrete rugged polysilicon grains further comprises:

forming an amorphous silicon (a-silicon) film on said semiconductor substrate;

seeding silicon nuclei on said a-silicon film; and annealing said semiconductor substrate.

6. The method of claim 1, wherein the step of forming said conducting plug comprises the following steps:

forming a doped polysilicon layer on said semiconductor substrate and filling into said contact hole; and etching back said doped polysilicon layer until said substrate is reached.

7. The method of claim 1, wherein said rugged polysilicon grain has a size about 500 to 2000 angstroms.

8. The method of claim 1, wherein a distance between each two adjacent said rugged polysilicon grains is about 500 to 1500 angstroms.

9. The method of claim 1, wherein said first conducting layer is formed of an in-situ doped polysilicon layer at a temperature about 540 to 580° C.

10. The method of claim 1, wherein said vertical fins have widths about 500 to 1500 angstroms.

11. The method of claim 1, wherein said first conducting layer is formed after the said cavities are formed.

12. A method for manufacturing a semiconductor capacitor, the method comprises the steps of:

forming a silicon oxide layer on a semiconductor substrate;

forming a silicon nitride layer on said silicon oxide layer;

etching said silicon oxide layer and said silicon nitride layer to form a contact hole on said silicon oxide layer and said silicon nitride layer and to expose a top surface of said semiconductor substrate;

forming a first conducting layer on said silicon nitride layer and filling into said contact hole;

etching back said first conducting layer until said silicon nitride layer is reached to form a conducting plug in said contact hole;

forming a dielectric layer on said silicon nitride layer and said conducting plug;

etching said dielectric layer to form an opening on said dielectric layer for exposing top surfaces of said conducting plug and a portion of said silicon nitride layer, and for defining a crown shaped pattern;

forming a plurality of discrete rugged polysilicon grains on surfaces of said dielectric layer, said conducting plug and said silicon nitride layer, wherein a distance between each two adjacent said discrete rugged polysilicon grains is less than 1500 angstroms;

etching said dielectric layer to form a plurality of cavities on a top surface of said dielectric layer by using said discrete rugged polysilicon grains to serve as an etching mask;

forming a second conducting layer on the surfaces of said discrete rugged polysilicon grains, said dielectric layer, said silicon nitride layer and said conducting plug, and filling into said cavities to form a plurality of vertical fins, wherein each of said vertical fins has a width less than 1500 angstroms;

removing a portion of said discrete rugged polysilicon grains and a portion of said second conducting layer to define a bottom electrode;

removing said dielectric layer;

forming a capacitor dielectric film on the outer surfaces of said first conducting layer, said discrete rugged polysilicon grains and said silicon nitride layer; and forming a third conducting layer on an outer surface of said capacitor dielectric film to serve as a top electrode.

13. The method of claim 12, wherein said dielectric layer is formed of a silicon oxide layer with a thickness about 5000 to 10000 angstroms.

14. The method of claim 13, wherein said dielectric layer is removed by an etchant comprised of a material selected from the group consisting of a BOE (buffer oxide etching) solution and a HF solution.

15. The method of claim 12, wherein the step of forming said discrete rugged polysilicon grains further comprises:

forming an a-silicon film on said semiconductor substrate;

seeding silicon nuclei on said a-silicon film; and annealing said semiconductor substrate.

16. The method of claim 12, wherein each of said discrete rugged polysilicon grains has a size about 500 to 2000 angstroms.

17. The method of claim 12, wherein a distance between two adjacent said discrete rugged polysilicon grains is about 500 to 1500 angstroms.

18. The method of claim 12, wherein said second conducting layer is formed of an in-situ doped polysilicon layer formed at a temperature about 540 to 580° C.

19. The method of claim 12, wherein each of said vertical fins has a width about 500 to 1500 angstroms.

20. The method of claim 12, wherein said second conducting layer is formed after the said cavities are formed.

* * * * *